United States Patent [19]

Lee

[11] Patent Number: 4,827,225

[45] Date of Patent: May 2, 1989

[54] FAST LOCKING PHASE-LOCKED LOOP UTILIZING FREQUENCY ESTIMATION

[75] Inventor: Kenneth K. Lee, Harrington Park, N.J.

[73] Assignee: Unisys Corporation, Blue Bell, Pa.

[21] Appl. No.: 206,058

[22] Filed: Jun. 13, 1988

[51] Int. Cl.[4] ............................ H03L 7/10; H03L 7/18
[52] U.S. Cl. ...................................... 331/10; 331/1 A;
                                                331/25; 329/122
[58] Field of Search .......................... 375/120, 81, 119;
            329/50, 109, 122; 328/155; 331/1 R, 1 A, 25,
                                                        17, 10

[56] References Cited

U.S. PATENT DOCUMENTS

| 4,511,858 | 4/1985 | Charavit et al. | 331/10 |
| 4,528,521 | 7/1985 | Grimes | 331/1 A |
| 4,764,737 | 8/1988 | Kaatz | 331/10 |

Primary Examiner—Robert L. Griffin
Assistant Examiner—Marianne Huseman
Attorney, Agent, or Firm—Albert B. Cooper

[57] ABSTRACT

A phase-locked loop compares the loop output clock with the loop input clock in a digital phase detector to provide lead/lag error signal samples. A microprocessor utilizes the lead/lag error samples to track the input clock in a wideband mode matching the bandwidth of the input and in a very narrow band mode. When the system in which the loop is utilized switches to a new input clock source, the microprocessor resets the loop divider chain so that the loop feedback signal is phase coincident with the input reference. The microprocessor tracks the new clock for a predetermined number of error samples in the wideband mode and statistically estimates, from the samples, the frequency of the input. After the frequency estimation, the microprocessor controls the loop VCO to output the computed frequency and switches to the narrow band tracking mode.

19 Claims, 2 Drawing Sheets

FAST LOCKING PHASE-LOCKED LOOP UTILIZING FREQUENCY ESTIMATION

BACKGROUND OF THE INVENTION

1. Field of the Invention

The invention relates to the phase-locked loop (PLL) technology particularly with respect to use in synchronous communication systems.

2. Description of the Prior Art

Phase-locked loops are ubiquitous in modern technologies for locking the loop output frequency to an input reference frequency. Phase-locked loops are widely used in digital communication networks employing synchronous communication for, inter alia, locking to a noisy input reference clock and outputting a clean clock corresponding thereto. In a synchronous network, data is transmitted from one network node to another along with a transmission clock to which it is synchronized. Generally, each node of the network includes a phase-locked loop that locks to a reference clock to generate a local node clock that is utilized for internal timing as well as for transmission with data to other nodes. Data received by a node is entered into an input buffer by the clock transmitted with the data. The data is strobed from the buffer for storage and use at the node by the local node clock generated by the node phase-locked loop. If the local node clock differs in frequency with respect to the clock received with the data, underflow or overflow errors will occur resulting in a loss of data. Overflow errors occur when the data is clocked into the buffer faster than it can be removed. Underflow errors occur when the data is removed from the buffer faster than it is clocked in. Thus, it is appreciated that it is of paramount importance that the clocks utilized in the system be frequency locked with respect to each other.

Another source of error that may result in data loss is phase jitter. Phase jitter is short term phase distortion (noise) experienced by a signal. When a clock plus data is transmitted from one node to another, the signals are contaminated by random phase delays resulting in phase jitter. It is appreciated, however, that the data and clock transmitted therewith remain phase synchronized with respect to each other so that the receiving node can utilize the clock to synchronously input the data. The transmitted clock and the transmitted data experience the same amount of jitter. The received clock and the internal node clock may, however, jitter with respect to each other so that data loss may result.

In networks utilizing synchronous communication, a source clock is designated and the phase-locked loop of a node denoted as a master node locks to the source clock. The PLL clock from the master node is transmitted to a further node to provide a reference clock thereto to which the PLL of the further node locks. The phase-locked loop of the further node then transmits a clock to a still further node. In this manner, in accordance with a protocol established for the network, all of the nodes are frequency locked to the source clock. If the source clock (or master node) should become inoperative, the system switches to a new source clock generally at a location different from the original source clock and generally designates a new master node. Since the source clocks available to a network may vary in frequency within a predetermined tolerance, the entire network must frequency lock to the new source. Such lock-up procedure may require an inordinately large amount of time during which substantial overflow and underflow errors may occur. Networks often utilize error detecting codes for detecting such overflow or underflow errors. The system is then controlled so that messages are repeatedly retransmitted until an error free transmission occurs. This process places an undesirable overhead on the network.

Wide bandwidth phase-locked loops may be utilized that exhibit fast lock-up time but introduce significant phase jitter during the locking process. During frequency lock-up, the phase-locked loop clocks are slipping with respect to each other to an extent that the network is effectively shut down until system wide synchronization has been reestablished. Although the nodes endeavor to transmit messages to each other during lock-up, errors are so prevalent that retransmissions continue until lock-up when the message is received without error.

In such prior art systems utilizing wide bandwidth phase-locked loops, the loop bandwidth is often significantly greater than the maximum bandwidth of the input reference clock to be tracked so as to minimize lock-up time when switching clock sources. Since larger bandwidth results in less phase jitter attenuation, such networks tend to introduced large errors during the lock-up process.

If narrow bandwidth phase-locked loops are utilized in the network, very long lock-up times are experienced. When utilizing narrow bandwidth phase-locked loops, the frequency tolerance of the source clocks must be held to a very narrow limit in order that underflow and overflow errors are held to an acceptably low level during the long lock-up time.

Prior art communication networks also utilize phase-locked loops that gradually converge to a narrow bandwidth mode from a wide bandwidth mode. Such slow convergence processes result in insufficient jitter attenuation during the locking process resulting in significant data transmission errors due to clock slippage.

Thus it is appreciated that in a synchronous communication environment, it is desirable to lock to a new reference clock as fast as possible. During the lock-up time, clock discrepancies such as frequency offset usually result in non-recoverable errors. The present day increase in the complexity of communication networks exacerbate the number of errors arising from a slow locking time. The locking time is the time duration from the introduction of a new clock source to when the node output clocks satisfy the jitter attenuation requirements of the system. Thus, conventional phase-locked loops with relatively long lock-up time result in large frequency offsets and concomitant transmission errors. Increasing the loop bandwidth to reduce the lock-up time results in an undesirably large increase in output jitter. In the conventional phase-locked loop technology, the amount of jitter attenuation decreases exponentially with respect to the duration of the lock-up time.

Thus, it is appreciated from the foregoing that the performance of the phase-locked loop is uniquely the most critical factor in the performance of synchronous communication systems. In present day communication systems, phase-locked loop designs are utilized that have been optimized for systems other than communication systems, such as control systems, which designs are not optimum for communication systems.

SUMMARY OF THE INVENTION

The phase-locked loop of the present invention obviates the disadvantages of the prior art described above by providing a phase-locked loop that instantaneously synchronizes to the reference clock by resetting the loop divider chain when a new reference clock is introduced. The loop then tracks the reference with a bandwidth matched to the reference bandwidth while accumulating the lead/lag data utilized in the loop tracking. After a predetermined time interval, the accumulated lead/lag data is utilized to statistically estimate the input clock frequency. The voltage controlled oscillator of the loop is set precisely to the computed frequency and tracking is continued in a narrow bandwidth mode.

DESCRIPTION OF THE PREFERRED EMBODIMENT

Figure 1:
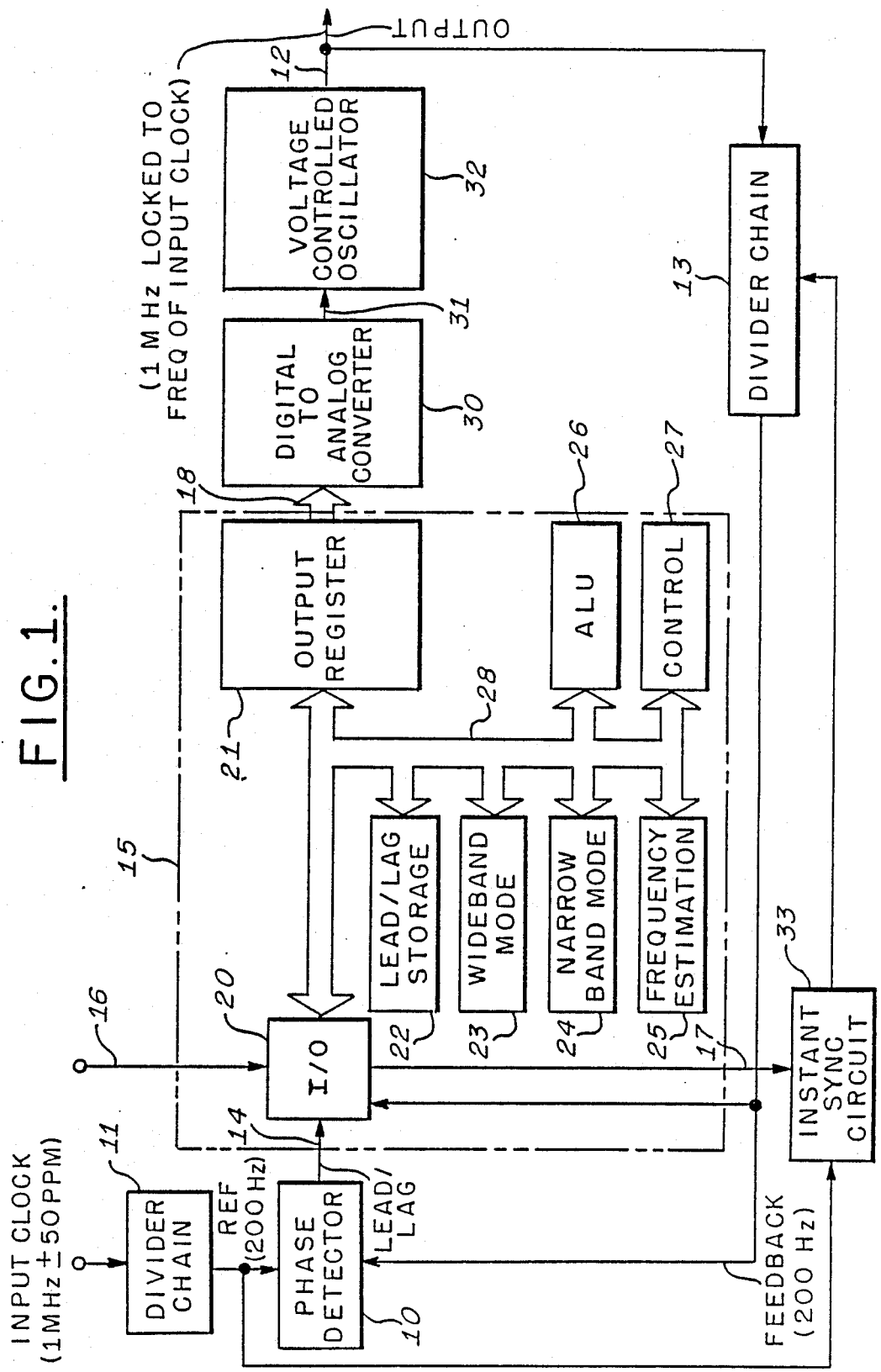
FIG. 1 is a schematic block diagram of the phase-locked loop implemented in accordance with the present invention.

Referring to FIG. 1, a schematic block diagram of a phase-locked loop implemented in accordance with the present invention is illustrated. An input reference source clock, to which it is desired that the loop lock, is applied to a digital phase detector 10 through a divider chain 11. The input reference source may, for example, comprise a 1 MHz clock with a tolerance of ±50 parts per million (PPM). The divider chan 11 comprises a sequence of digital dividers to divide the input reference by, for example, 5,000, yielding a reference clock of nominally 200 Hz. The output clock from the phase-locked loop is applied on a line 12 through a digital divider chain 13 to provide the loop feedback signal to a second input of the phase detector 10. The output clock may also comprise a 1 MHz signal which by the action of the phase-locked loop is frequency locked to the input reference. The divider chain 13 is similar to the divider chain 11 and provides a nominal 200 Hz feedback signal to the phase detector 10. The phase detector 10 is preferably implemented by a D flip-flop clocked by the feedback signal from the divider chain 13 with the reference from the divider chain 11 applied to the D input thereof. The flip-flop is clocked on the rising edge of the feedback signal transferring the state of the reference signal at the D input to the Q output thereof. The Q output of the flip-flop provides a lead/-lag signal on a line 14 which comprises the loop error signal. It is appreciated that if the rising edge of the feedback signal is leading the rising edge of the reference signal, a binary ZERO will be transferred to the Q output of the phase detector 10. If, however, the rising edge of the feedback signal is lagging the rising edge of the reference signal, a binary ONE will be transferred to the Q output of the phase detector 10. The Q' output of the phase detector 10 may alternatively provide the lead/lag signal on the line 14 in which case binary ONE will be provided for a leading sample and binary ZERO for a lagging sample. It is appreciated that the digital phase detector 10 does not provide the magnitude of the phase error but only the lead/lag polarity thereof.

The lead/lag error signal on the line 14 is applied to a microprocessor 15 which performs the functions of loop locking control and loop filtering in a manner to be described. The microprocessor 15 is preferably implemented by a Motorola 68HCO5. The microprocessor 15 receives an interrupt signal on a line 16 from the communication system in which the loop is utilized indicating when the system has switched to a new reference source clock. The microprocessor 15 also receives the 200 Hz feedback signal from the divider chain 13 for controlling entry of the lead/lag data on the line 14 as well as to inform the microprocessor 15 when a predetermined number of lead/lag samples have been received. The microprocessor 15 also provides an instant sync enabling signal on a line 17 and a parallel digital frequency controlling signal on a bus 18 for reasons to be explained.

The microprocessor 15 includes an input/output (I/O) section 20 for receiving the lead/lag error signal on the line 14, the new source signal on the line 16 and the feedback signal from the divider chain 13. The I/O section 20 of the microprocessor 15 interfaces in outputting the instant sync enabling signal on the line 17 and the frequency controlling signal on the bus 18. The microprocessor 15 includes an output register 21 for providing the frequency controlling signal to the bus 18. Included in the microprocessor 15 is lead/lag storage 22 for storing a predetermined number of samples of the lead/lag data provided on the line 14. The microprocessor 15 also includes a wideband mode control system 23 for controlling the phase-locked loop in a wideband tracking mode in a manner to be described. Also included in the microprocessor 15 is a narrow band mode control section 24 for controlling the loop in a narrow band tracking mode in a manner to be described. A frequency estimation section 25 is included in the microprocessor 15 for providing a frequency estimate of a newly received input reference source in accordance with the operation of the invention in a manner to be explained. The microprocessor 15 conventionally includes an arithmetic and logic unit 26 for performing the arithmetic and logic operations required in implementing the present invention. A control section 27 is included for timing and controlling the various operations performed in operating in accordance with the present invention in a manner to be described. The components 20-27 are interconnected by a bus 28 for intercommunication therebetween.

The digital frequency controlling signal on the bus 18 is applied to a digital-to-analog converter 30 that provides an analog frequency control voltage on a line 31 corresponding to the digital signal on the line 18. The analog voltage on the line 31 is applied to the input of a voltage to frequency converter 32 implemented as a voltage controlled oscillator (VCO). The VCO 32 provides the output clock on the line 12. As discussed above, the output clock on the line 12 is applied through the divider chain 13 to provide the feedback signal to the phase detector 10. It is appreciated that the digital number placed in the output register 21 of the microprocessor 15 controls the frequency of the VCO 32. The output frequency on the line 12 is a linear function of the input voltage on the line 31. The center frequency of the VCO 32 is selected to be the nominal clock frequency ($F_O$) of the communication system in which the phase-locked loop is utilized. Thus, the output frequency on the line 12 is increased or decreased with respect to $F_O$ by increasing or decreasing the input voltage on the line 31.

The PLL of the present invention includes an instant sync circuit 33 that it utilized for resetting the divider chain 13 to zero. The divider chain is reset upon the occurrence of the first falling edge of the reference clock from the divider chain 11 after the signal on the line 16 informs the microprocessor 15 that the system has just switched to a new clock source. Accordingly, the instant sync circuit 33 is coupled to receive the reference clock from the divider chain 11 and is enabled to reset the divider chain 13 by the signal on the line 17 from the microprocessor 15. The instant sync circuit 33 is conveniently implemented by a monostable multivibrator. Thus, immediately upon a new clock source being switched into the system, the divider chain 13 is reset so that the feedback signal into the phase detector 10 is aligned to be in-phase with the reference signal into the phase detector 10. The falling edges of the feedback and reference signals are aligned in time immediately upon switching source clocks.

It is appreciated generally with respect to phase-locked loops that the larger the loop bandwidth, the faster the lock-up time but the less jitter attenuation. The loop bandwidth is the magnitude of the frequency offset to which the phase-locked loop can lock. The sampling frequency of the phase-locked loop is the rate at which the output frequency is compared to the reference frequency to update the lead/lag information. The higher the sampling frequency, the larger the bandwidth. In the phase-locked loop exemplified above, the sampling frequency is 200 Hz and the bandwidth of the input reference clock is ±50 PPM.

In accordance with the present invention, when a new reference clock source is introduced, a signal is applied to the line 16 to inform the microprocessor 15 that a new clock source has been introduced. The microprocessor 15 then enables the instant sync circuit 33 via the line 17. It is appreciated that the line 16 will be enabled whether a new external system clock is introduced or a new internal node clock is placed on line. In response to the enabling signal on the line 17, the instant sync circuit 33 resets the divider chain 13 in synchronism with the next occurring falling edge of the 200 Hz reference from the divider chain 11. Thus, the 200 Hz reference clock and the 200 Hz feedback clock are immediately synchronized to provide an ideal phase-locked starting point from which the phases of the two signals are compared with respect to each other for tracking purposes. It is appreciated that because of system design, the input and output clock frequencies may differ from one another by at most ±50 PPM.

After the instant sync process, a fast locking mode is entered comprising wideband tracking of the input reference clock and estimation of the input reference frequency. Under control of the 200 Hz feedback signal, the microprocessor 15 samples the output of the phase detector 10 on the rising edges of the feedback signal. Thus, as previously discussed, the lead/lag error signal on the line 14 is sampled at a 200 Hz rate in the described embodiment of the invention. In the wideband tracking mode, the components 21, 23, 26 and 27 cooperate to increment or decrement the number stored in the output register 21 so as to increase or decrease, respectively, the frequency of the output clock on the line 12 by 50 PPM. If the feedback signal is lagging the reference signal at the sample time, the output frequency on the line 12 is increased by 50 PPM. If the feedback signal is leading the reference signal at the sample time, the frequency of the output clock on the line 12 is decreased by 50 PPM. It is therefore appreciated that the bandwidth of the phase-locked loop is never greater than the maximum bandwidth of the input reference clock tracked by the loop. This provides minimum PLL output jitter during the locking process and thus reduces the amount of clock slippage that causes underflow and overflow errors in the communication system or network in which the PLL is utilized. This is different from conventional PLL design that begins with an unnecessarily large bandwidth to achieve a fast locking time but consequently generates large underflow or overflow errors.

During the wideband tracking mode, the lead/lag samples are stored in lead/lag storage 22. A predetermined number of samples are stored for the purposes of input frequency estimation. In the preferred embodiment, the input clock is tracked for one second accumulating 200 lead/lag samples (the number of times the reference 200 Hz clock was leading or lagging with respect to the VCO output frequency on the line 12). As discussed above, the wideband locking range (bandwidth) is ±50 PPM. Thus, the lead/lag information provided by the digital phase detector 10 is stored in the memory 22 while the PLL remains in lock utilizing the minimum required bandwidth.

After the accumulation of the predetermined number of lead/lag samples in the memory 22, the components 21, 22, 25, 26 and 27 generate an exact statistical estimate of the input clock frequency utilizing the lead/lag information stored in the memory 22. The frequency estimate section 25 utilizes a statistical averaging method. In the preferred embodiment of the invention, the following equation is utilized:

F(REF)=[(NUMBER OF LEADS−NUMBER OF LAGS)/NUMBER OF SAMPLES]*BW(PPM)++NOMINAL FREQUENCY($F_O$)

where

F(REF)=estimated reference frequency

NUMBER OF LEADS=number of stored lead samples

NUMBER OF LAGS=number of stored lag samples

NUMBER OF SAMPLES=200 in the preferred embodiment

BW(PPM)=bandwidth in PPM (50 PPM in exemplified embodiment)

NOMINAL FREQUENCY($F_O$)=1 MHz in exemplified embodiment

After estimation of the exact input reference frequency, the VCO 32 is controlled to provide this frequency by appropriately setting the output register 21. The PLL is then controlled by the control section 27 of the microprocessor 15 to enter a narrow band tracking mode implemented by the components 21, 24, 26 and 27. In the narrow band tracking mode, the number in the output register 21, which now represents the exact nominal frequency, is incremented or decremented, in response to each lead/lag sample from the phase detector 10, by an amount to increase or decrease the VCO output frequency on the line 12 by a narrow tolerance such as, for example, ±2 PPM. THe bandwidth in the narrow band mode may be arbitrarily narrow within the stability criteria of the loop. In response to a lag sample, the output frequency on the line 12 is increased by 2 PPM and in response to a lead sample, the output frequency is decreased by 2 PPM. The PLL then remains in the narrow band tracking mode until the signal on the line 16 indicates that a new reference clock source has been introduced.

The frequency estimate and narrow band mode provides a single step process in which the PLL enters a narrow output bandwidth mode for maximum input jitter attenuation while never going out of lock. This provides an exceedingly fast locking time from the introduction of an input reference clock to the time when the PLL enters the narror bandwidth mode. This differs from conventional techniques where a converging process is utilized for entering a narrow bandwidth mode. The prior art slow coverging process provides insufficient jitter attenuation during the locking process in transmission errors due to clock slippage.

In a conventional analog PLL, an integrator responsive to the lead/lag output of the phase detector provides the control voltage for the VCO. The integrator also functions as the loop lowpass filter in a manner well understood in the art. It is appreciated from the foregoing description of the operation of the digital phase-locked loop of the present invention, that the microprocessor 15 functions as the loop filter. The above-described operations in effect provide filtering of spurious high frequency noise components.

Figure 2:
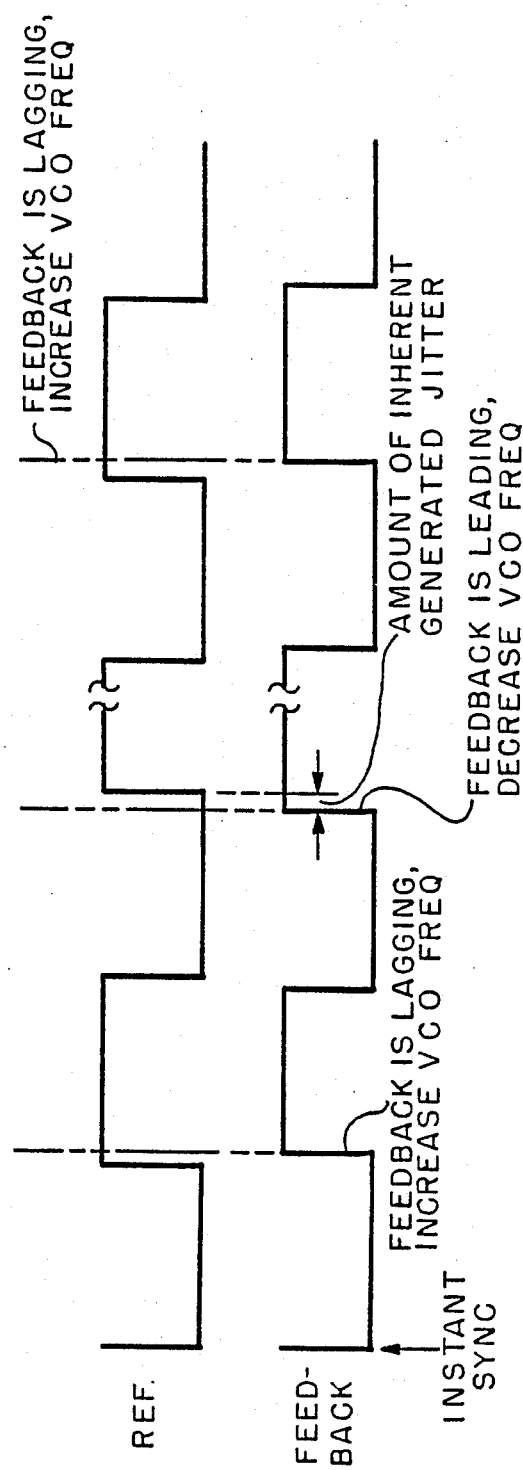
FIG. 2 is a graph illustrating the phase sampling process utilized by the phase-locked loop of FIG. 1 to remain in lock.

Referring to FIG. 2, the phase sampling and correction process of the PLL of FIG. 1 to remain in lock is illustrated with respect to the reference and feedback clock signals. As illustrated, when a new reference clock is introduced to the PLL, the microprocessor 15 activates the instant sync circuit 33 which aligns the reference and feedback clocks on the falling edges thereof. Thereafter, correction is effected in accordance with whether the phase of the feedback clock is leading or lagging the reference clock. When the feedback is lagging the VCO frequency is increased. When the feedback is leading, the VCO frequency is decreased. Jitter is generated on the output clock because of the correction process since the two clock edges can never be exactly aligned. THe output jitter is referred to as generated or inherent jitter or phase noise.

Figure 3:
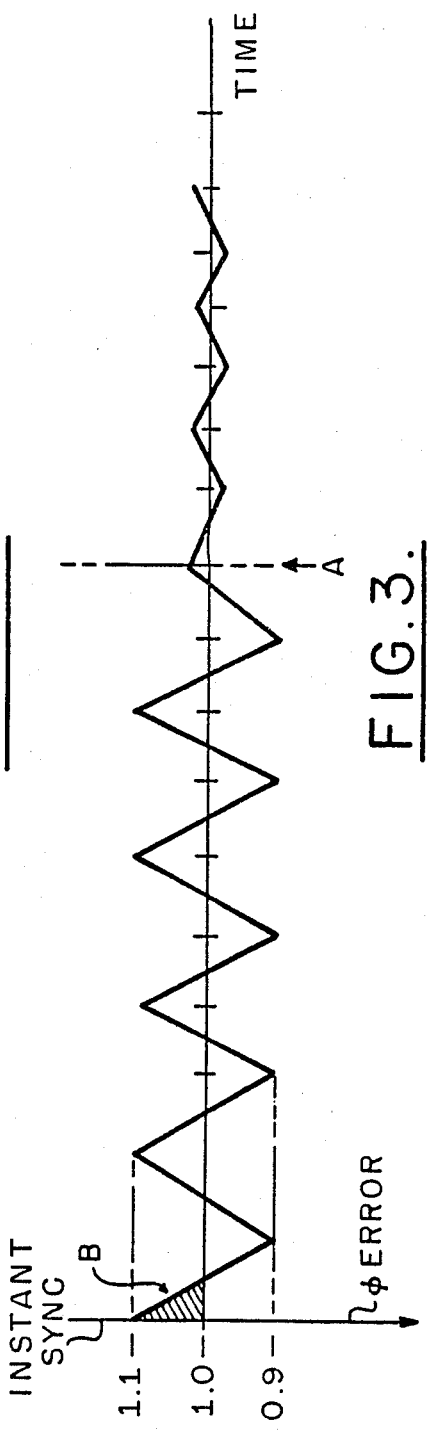
FIG. 3 is a graph of phase error versus time for the operating modes of the phase-locked loop of FIG. 1.

Referring to FIG. 3, the step response to a phase-locked loop utilizing the fast locking technique of the present invention is illustrated. The locking range of the loop with respect to unity is 0.1 to 1.1. The shaded area B illustrates the maximum phase error or clock slip. The loop is locked at the point of instant sync. At point A, the fast clock frequency estimated value and narrow band tracking is established for maximum jitter attenuation. It is appreciated that the maximum phase error is significantly less than with conventional techniques with significantly less output jitter during lock-up. A faster locking time is also provided.

The PLL of the present invention begins tracking an input reference clock instantly. As soon as the reference clock is introduced to the PLL, the PLL will lock thereto and thereafter track perfectly without frequency offset. In a communcation system, this results in minimum frequency offset between network nodes. The fast locking technique of the present invention converges to the input reference clock in an optimum manner while filtering the input jitter. The input jitter can be reduced to any level in an optimum time. With conventional PLL techniques, large frequency offsets are encountered because of long lock-up times. There is no frequency offset with the present invention. With conventional PLL techniques, large amounts of output jitter may be generated during lock-up if the lock-up time is to be reduced. With the present invention, the output jitter is minimized to meet the loop tracking requirements. With conventional phase-locked loop techniques, there is an exponential relationship between desired jitter attenuation and lock-up time duration. With the present invention, the PLL rapidly enters the narrow band mode whereby output jitter attenuation is a linear function.

Although the invention was described in terms of utilization in a communication system, it is appreciated that the invention may be utilized in other environments requiring a PLL for the advantages that the invention provides.

While the invention has been described in its preferred embodiment, it is to be understood that the words which have been used are words of description rather than limitation and that changes may be made withing the purview of the appended claims without deparing from the true scope and spirit of the invention in its broader aspects.

I claim:

1. Phase-locked loop apparatus for locking to an input reference signal comprising a source of output signal having a controllably variable frequency, said source being responsive to a frequency control signal for controlling said frequency, frequency divider means responsive to said output signal for frequency dividing said output signal to provide a feedback signal, synchronizing means responsive to said input reference signal for setting said frequency divider means to a predetermined state in accordance with a predetermined phase of said input reference signal, phase detector means responsive to said input reference signal and said feedback signal for providing an error signal representative of whether said feedback signal is phase leading or phase lagging said input reference signal, tracking means responsive to said error signal for adjusting said frequency control signal in accordance with said error signal so that the frequency of said feedback signal approaches the frequency of said input reference signal, storage means for storing a predetermined number of samples of said error signal, and estimating means responsive to said stored samples for computing a frequency in accordance therewith related to the frequency of said input reference signal and adjusting said frequency control signal in accordance with the computed frequency so that the frequency of said feedback signal equals the frequency of said input reference signal.

2. The apparatus of claim 1 wherein said source of output signal comprises a voltage controlled oscillator.

3. The apparatus of claim 2 wherein said tracking means, said storage means and said estimating means are implemented by a microprocessor for providing a digital signal for adjustung said frequency control signal.

4. The apparatus of claim 3 further including a digital-to-analog converter responsive to said digital signal from said microprocessor for providing said frequency control signal.

5. The apparatus of claim 1 wherein said frequency divider means comprises a digital frequency divider.

6. The apparatus of claim 5 wherein said synchronizing means comprises means for resetting said digital frequency divider to zero in synchronism with a falling edge of said input reference signal so that a falling edge of said feedback signal occurs in synchronism with said falling edge of said input reference signal.

7. The apparatus of claim 6 further including means for receiving an interrupt signal representative of switching to a new source clock, said synchronizing means further including means responsive to said interrupt signal for enabling said synchronizing means upon receipt of said interrupt signal.

8. The apparatus of claim 7 including further frequency divider means responsive to an input clock signal for frequency dividing said input clock signal to provide said input reference signal.

9. The apparatus of claim 8 wherein said apparatus is constructed and arranged to track said input clock signal with a bandwidth no greater than the bandwidth of said input clock signal.

10. The apparatus of claim 9 wherein said phase detector means comprises a digital phase detector for providing a binary error signal representative of whether said feedback signal is phase leading or phase lagging said input reference signal.

11. The apparatus of claim 10 wherein said digital phase detector comprises a flip-flop with one of said feedback signal and input reference signal as the input thereto and clocked by the other of said feedback signal and input reference signal.

12. The apparatus of claim 10 wherein said tracking means includes means for sampling said binary error signal thereby providing said samples of said error signal.

13. The apparatus of claim 12 wherein said tracking means comprises
   a wideband tracking means for adjusting said frequency control signal in response to each sample of said error signal so that said frequency of said output signal is modified by a frequency change amount commensurate with said bandwidth of said input clock signal, and
   narrow band tracking means for adjusting said frequency control signal in response to each sample of said error signal so that the frequency of said output signal is modified by an mount substantially less than said frequency change amount of said wideband tracking means.

14. The apparatus of claim 1 including control means for enabling said wideband tracking means upon receipt of said interrupt signal and for enabling said narrow band tracking means when said estimating means adjusts said frequency control signal in accordance with said computed frequency.

15. The apparatus of claim 12 wherein said estimating means comprises means for computing the frequency of said input clock signal in accordance with said predetermined number of samples of said error signal and for adjusting said frequency control signal in accordance with the computed frequency so that the frequency of said output signal equals the frequency of said input clock signal.

16. The apparatus of claim 15 wherein said estimating means comprises means for computing said frequency in accordance with the difference between the number of said phase leading samples and the number of said phase lagging samples.

17. The apparatus of claim 16 wherein said estimating means comprises means for computing said frequency in accordance with the difference between the number of said phase leading samples and the number of said phase lagging samples divided by said predetermined number of samples.

18. The apparatus of claim 17 wherein said estimating means comprises means for computing said frequency in accordance with
   F(REF)=[(NUMBER OF LEADS−NUMBER OF LAGS)/NUMBER OF SAMPLES]*BW(PPM)+NOMINAL FREQUENCY($F_O$)
   where
   F(REF)=estimated reference frequency
   NUMBER OF LEADS=number of stored lead samples
   NUMBER OF LAGS=number of stored lag samples
   NUMBER OF SAMPLES=said predetermined number of samples
   BW(PPM)=bandwidth in parts per million (said frequency changing amount of said wideband tracking means)
   NOMINAL FREQUENCY($F_O$)=nominal frequency of said input clock signal.

19. The apparatus of claim 10 wherein said tracking means includes means responsive to said feedback signal for sampling said binary error signal in accordance therewith thereby providing said samples of said error signal.

* * * * *